(12) United States Patent
Watanabe (10) Patent No.: US 6,443,741 B1
(45) Date of Patent: Sep. 3, 2002

(54) SOCKET FOR ELECTRICAL PARTS

(75) Inventor: Tsuyoshi Watanabe, Kawaguchi (JP)

(73) Assignee: Enplas Corporation, Saitama-ken (JP)

( * ) Notice: Subject to any disclaimer, the term of this patent is extended or adjusted under 35 U.S.C. 154(b) by 0 days.

(21) Appl. No.: 09/465,548

(22) Filed: Dec. 16, 1999

(51) Int. Cl.[7] ............................................... H01R 12/00
(52) U.S. Cl. ............................................. 439/71; 439/73
(58) Field of Search ........................... 439/71, 73, 331, 439/66, 67, 74, 68, 372, 373, 226

(56) References Cited

U.S. PATENT DOCUMENTS

| | | | |
|---|---|---|---|
| 5,074,798 A | * 12/1991 | Carter | 439/331 |
| 5,120,238 A | * 6/1992 | Marks et al. | 439/331 |
| 5,123,855 A | * 6/1992 | Petersen | 439/226 |
| 5,364,284 A | * 11/1994 | Tohyama et al. | 439/71 |
| 5,609,497 A | * 3/1997 | Kawabe | 439/331 |
| 5,628,645 A | * 5/1997 | Matsuoka et al. | 439/331 |
| 5,658,153 A | * 8/1997 | Ikeya et al. | 439/72 |
| 5,823,794 A | * 10/1998 | Abe | 439/98 |
| 5,865,639 A | * 2/1999 | Fuchigami et al. | 439/71 |
| 6,155,859 A | * 12/2000 | Choy | 439/331 |

* cited by examiner

Primary Examiner—Gary Paumen
Assistant Examiner—James R. Harvey (74) Attorney, Agent, or Firm—Fish & Richardson P.C.

(57) ABSTRACT

A socket for an electrical part comprises a socket body having an accommodation portion in which an electrical part having a number of terminals is accommodated, a number of contact pins arranged to the socket body so as to be contacted to or separated from the terminals of the electrical part, a pressure cover mounted to the socket body to be pivotal through a shaft member at one end portion thereof in a manner that, when the pressure cover is pivoted in a cover closed direction, the electrical part is pressed and held so that the terminals of the electrical part are contacted to the contact pins, respectively, an arm member attached to another end portion of the pressure cover to be rotatable, a latch member attached to the arm member to be rotatable so as to be engaged with or separated from the socket body, and a link member connecting the latch member and the pressure cover. When the arm member is rotated in the pressure cover closing direction, the latch member is rotated through the link member to be engaged with the socket body and, thereafter, when the arm member is further rotated in the same direction, the pressure cover further approaches the socket body. On the other hand, when the arm member is rotated in the pressure cover opening direction, the latch member is rotated through the link member in a direction to release the engagement of the latch member with the socket body. The latch member may be attached to the socket body, and in this case, the latch member and the arm member are connected through the link member.

8 Claims, 10 Drawing Sheets

SOCKET FOR ELECTRICAL PARTS

BACKGROUND OF THE INVENTION

1. Field of the Invention

The present invention relates to a socket for an electrical part, which detachably supports the electrical part such as IC package, particularly having a structure for making strong a pressing force against the electrical part.

2. Relevant Art of the Invention

Figure 14:
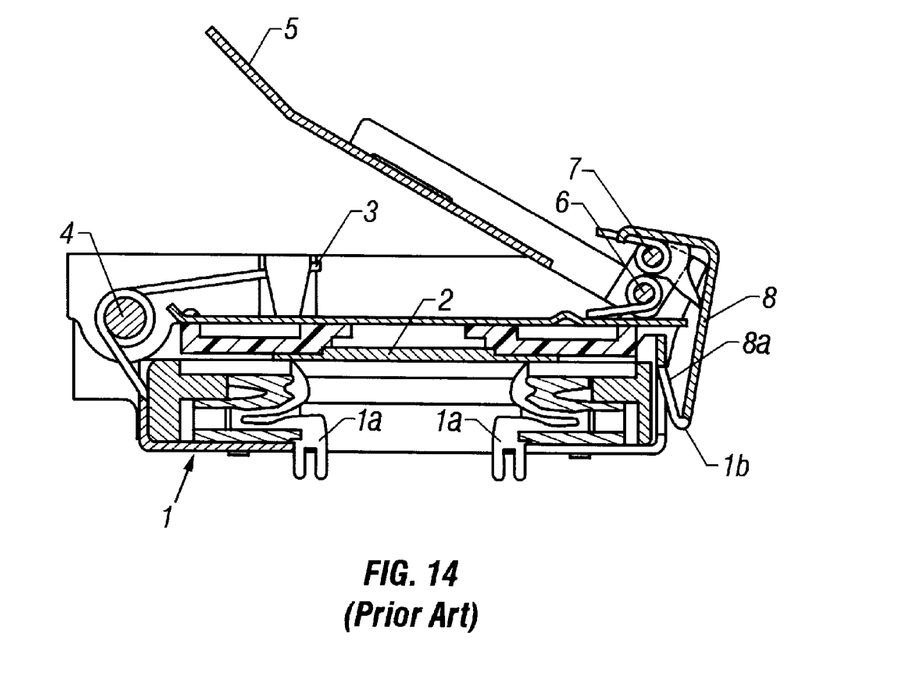
FIG. 14 is a sectional view showing an IC socket of a conventional structure.

An IC socket as a conventional socket for an electrical part is for example shown in FIG. 14 and disclosed in U.S. Pat. No. 5,120,238.

That is, with reference to FIG. 14, reference numeral 1 denotes a socket body to which an IC package 2 is mounted to achieve electrical conduction to contact pins 1a, and a pressure cover 3 is attached to the socket body 1 to be pivotal through a shaft (shaft pin) 4. The pressure cover 3 has a front end side to which a lever member 5 is attached to be pivotal through a shaft (shaft pin) 6. A stopper member 8 is disposed to be pivotal about a shaft (shaft pin) 7 through which the stopper member 8 is separated in position from the lever member 5 and the shaft 6. The stopper member 8 is provided with an engaging portion 8a which is engageable with an engagement portion 1b of the socket body 1.

With the structure shown in FIG. 14, under the condition of the engaging portion 8a of the stopper member 8 being engaged with the engagement portion 1b of the socket body 1, when the lever member is rotated in a counterclockwise direction in FIG. 14, the shaft 7 is also rotated in the counterclockwise direction about the shaft 6. As a result, since the distance between the shaft 7 and the engaging portion 8a of the stopper member 8 is not changed, the pressure cover 3 is pivoted downward in accordance with the rotation of the shaft 7 thereby to increase the pressing force against the IC package 2.

However, in such conventional structure, since the pressure cover 3 is pressed downward by utilizing the rotational motions of two shafts 6 and 7, in order to change the pressing-down amount of the pressure cover 3 and/or a timing for engaging the engaging portion 8a of the stopper member 8 with the socket body 1, it is necessary to improve the structure thereof, for example, by making large the distance between both the shafts 6 and 7, thus providing a problem.

Furthermore, in the conventional structure, the opening/closing operation of the pressure cover 3 and the pivoting operation of the lever member 5 must be done in separated two stages, and particularly, when the cover 3 is opened, it is necessary to lift up the lever and to disengage the stopper member 8 from the socket body by hands or using an automatic machine, thus providing a troublesome operational inconvenience.

SUMMARY OF THE INVENTION

An object of the present invention is to substantially eliminate defects or drawbacks encountered in the prior art mentioned above and to provide, in one aspect, a socket for an electrical part comprising:

a socket body having an accommodation portion in which an electrical part having a number of terminals is accommodated;

a number of contact pins arranged to the socket body so as to be contacted to or separated from the terminals of the electrical part;

a pressure cover mounted to the socket body to be pivotal at one end portion thereof in a manner that, when the pressure cover is pivoted in a cover closed direction, the electrical part accommodated in the accommodation portion of the socket body is pressed and held so that the terminals of the electrical part are contacted to the contact pins, respectively;

an arm member attached to another end portion of the pressure cover to be rotatable;

a latch member attached to the arm member to be rotatable so as to be engaged with or separated from the socket body;

a link member operatively connecting the latch member and the pressure cover, wherein when the arm member is rotated in one direction, the latch member is rotated through the link member to be engaged with the socket body and when the arm member is further rotated in the same direction, the pressure cover further approaches the socket body, and on the other hand, when the arm member is rotated in another direction, the latch member is rotated through the link member in a direction to release the engagement of the latch member with the socket body.

In another aspect, there is also provided a socket for an electrical part comprising:

a socket body having an accommodation portion in which an electrical part having a number of terminals is accommodated;

a number of contact pins arranged to the socket body so as to be contacted to or separated from the terminals of the electrical part;

a pressure cover mounted to the socket body to be pivotal through a shaft member at one end portion thereof in a manner that, when the pressure cover is pivoted in a cover closed direction, the electrical part accommodated in the accommodation portion of the socket body is pressed and held so that the terminals of the electrical part are contacted to the contact pins, respectively;

an arm member attached to another end portion of the pressure cover to be rotatable;

a latch member attached to another end portion of the pressure cover to be rotatable;

a link member operatively connecting the latch member and the latch member, wherein when the arm member is rotated in one direction, the latch member is rotated through the link member to be engaged with the socket body and, thereafter, when the arm member is further rotated in the same direction, the pressure cover further approaches the socket body, and on the other hand, when the arm member is rotated in another direction, the latch member is rotated through the link member in a direction to release the engagement of the latch member with the socket body.

In both the above aspects, the above-mentioned one rotating direction of the arm member is a direction for closing the pressure cover and the another rotating direction thereof is a direction for opening the pressure cover.

The latch member is provided with a hook and the socket body is provided with an engagement portion which is engaged with the hook of the latch member.

In preferred embodiments, the socket is an IC socket and the electrical part is an IC package.

According to the socket for the electrical part of the structures and characters mentioned above, the pressure cover is operated by means of the arm members. When the arm members are rotated, the latch members are also rotated through the link members so as to be engaged with or separated from the socket body. Accordingly, the opening amount and the opening timing of the latch members can be easily set by exchanging only the link members. Furthermore, the opening/closing of the pressure cover can be performed only through the operation of the arm members.

The nature and further characteristic features of the present invention will be made further clear from the following descriptions made with reference to the accompanying drawings.

BRIEF DESCRIPTION OF THE DRAWINGS

In the accompanying drawings:

FIG. 12 includes FIGS. 12A, 12B and 12C showing operations of the latch member, the arm member and the like of the first embodiment;

DESCRIPTION OF THE PREFERRED EMBODIMENTS

The present invention will be described hereunder with reference to the accompanying drawings by way of preferred embodiments.

[First Embodiment]

FIGS. 1 to 12 represent a first embodiment of the present invention.

With reference to FIGS. 1 to 12, reference numeral 11 denotes an IC socket as "socket for electrical parts", and the IC socket 11 is adapted to electrically connect terminals of an IC package 12 to a printed circuit board, not shown, of a measuring device (tester) for carrying out a performance test of the IC package 12.

The IC package 12, though the details thereof are omitted to be described herein, is so-called an LGA, (Laid Grid Array) type, in which a number of terminals are arranged to a lower surface of a package body 12a having approximately square plate shape and these terminals are formed in a lattice (grid) arrangement having vertical (Y) and horizontal (X) rows.

Further, the IC socket 11 is generally composed of a socket body 13 mounted to the printed circuit board and a pressure cover 14 pivotally mounted to the socket body 13.

The socket body 13 is provided with a contact pin base 17 which forms a cavity (hollow portion) and is dividable into lower and upper sections 17f and 17g. The contact pins 16 are arranged to the socket body 13 in the manner such that a recessed portion is formed by removing the lower contact pin base section 17f, a plurality of horizontally laminated alignment plates 18 into which the contact pins 16 are fitted are inserted into the recessed portion, and the alignment plates 18 are then fixed to the socket body so that the lower contact pin base section 17f is bonded to the upper contact pin base section 17g.

Figure 3:
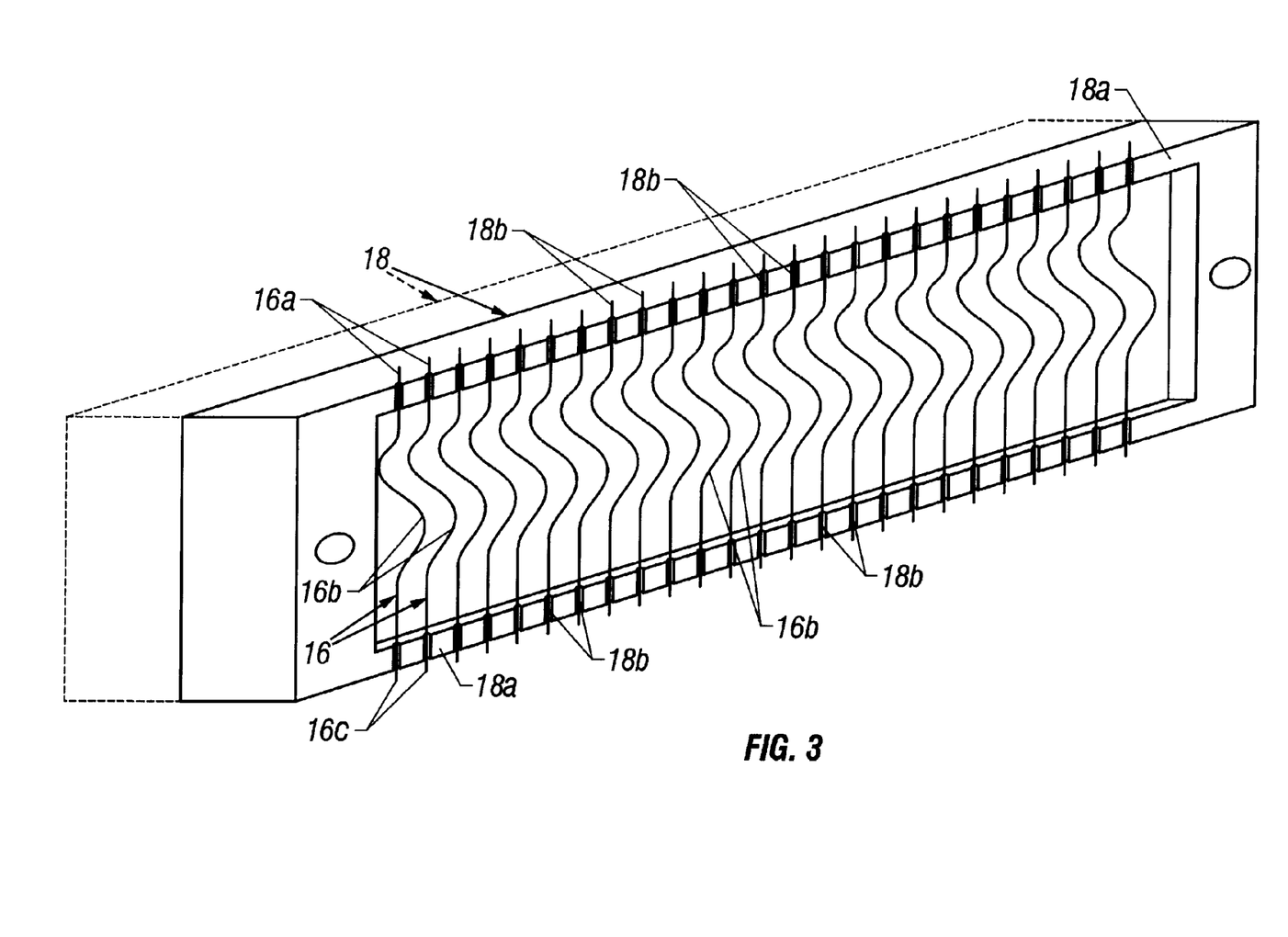
FIG. 3 is a perspective view showing a structure of an alignment plate and contact pins according to the first embodiment.

One example of such alignment plate 18 is shown in FIG. 3, and with reference to FIG. 3, the alignment plate 18 is formed, at its one side, with a rib 18a by making thick a plate thickness of the peripheral edge portion thereof, and to the upper and lower, as viewed, edge portions, there are formed a plurality of notches (cut portions) 18b, of the numbers corresponding to the number of the contact pins 16 in one row of Y or X row of its arrangement, so as to accord with interval of the arrangement of terminals of the IC package 12 accommodated in the IC socket 11. Portions of the contact pins 16 near the upper and lower end portions 16a and 16c thereof are fitted into these notches 18b, respectively. In such manner, the contact pins 16 are arranged to the alignment plate 18, and a plurality of these alignment plates 18 are laminated thereby to realize the lattice arrangement of the contact pins 16.

Each of the contact pins 16 has an intermediate portion formed as a spring portion 16b to be elastically deformable. The upper end portion 16a of the contact pin 16 is inserted into the insertion hole 17a of the upper contact pin base section 17g so as to abut against the terminal of the IC package 12. On the other hand, the lower end portion 16c of the contact pin 16 is inserted through insertion holes 17h formed to the lower contact pin base section 17f and then inserted into insertion holes 15a of a location board 15.

Figure 1:
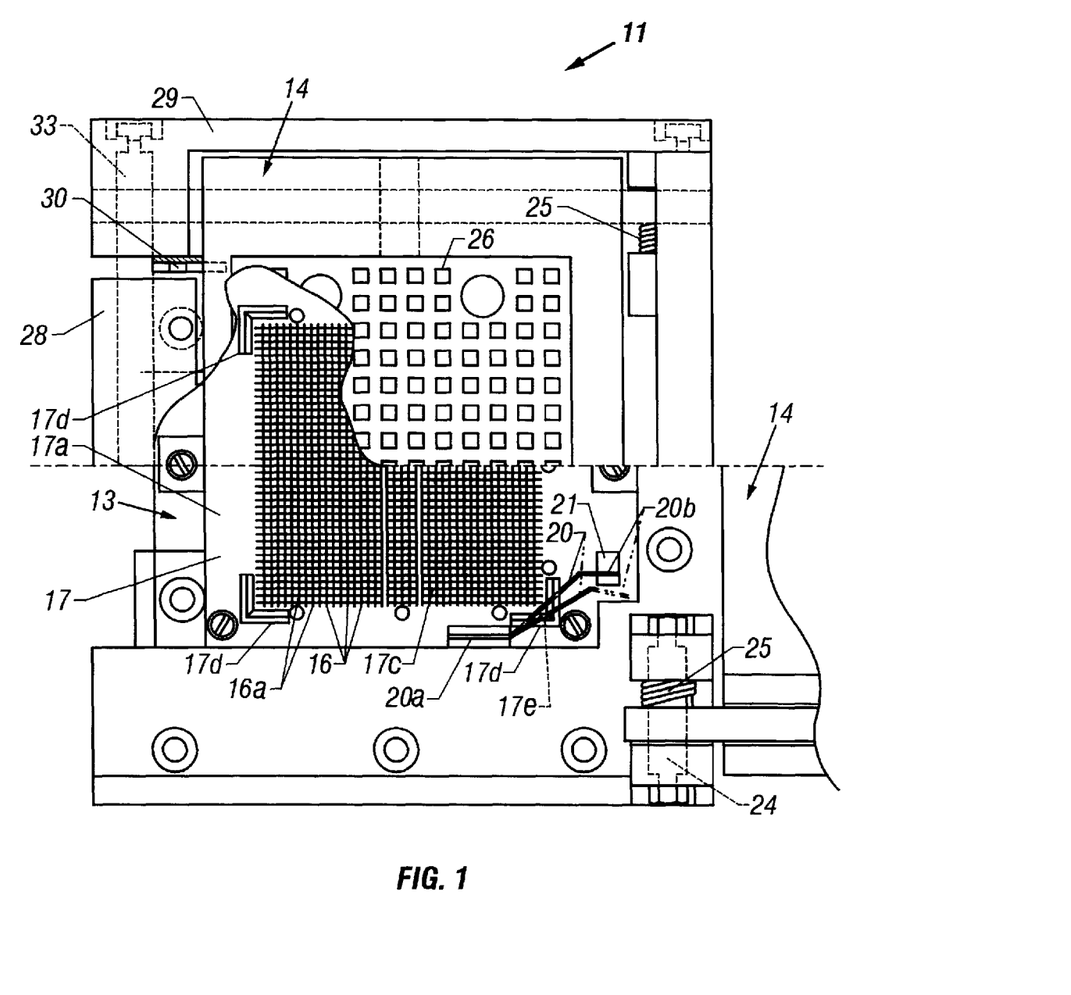
FIG. 1 is a plan view of an IC socket, partially cut away, according to a first embodiment of the present invention.
Figure 2:
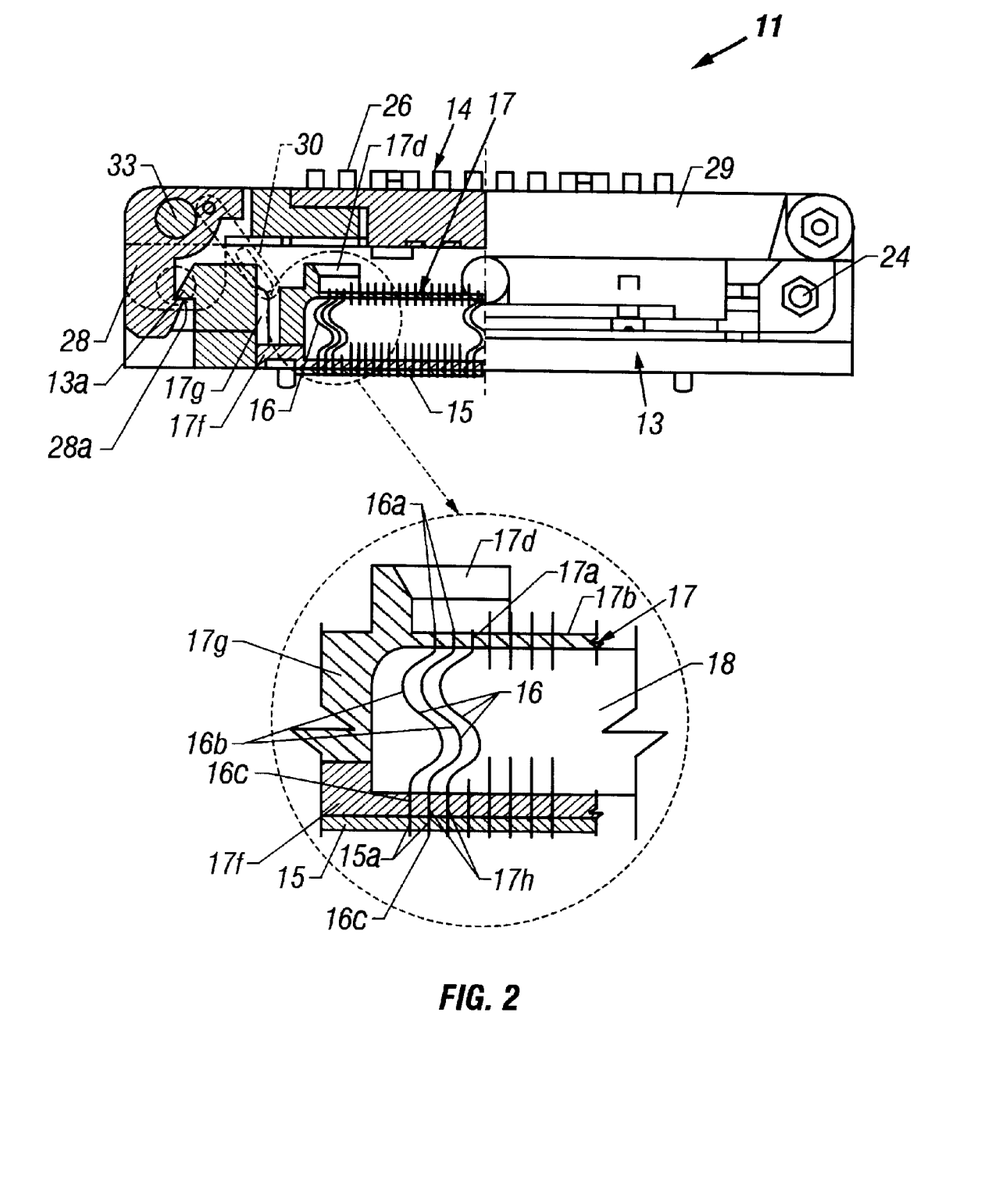
FIG. 2 is a front view, half in section, of the IC socket of the first embodiment shown in FIG. 1, including an encircled portion in an enlarged scale.

The upper contact pin base section 17g is formed, to its upper surface, with an accommodation (housing) portion 17b for accommodating or housing the IC package 12 and the number of contact pins 16 are arranged in lattice shape to the accommodation portion 17b so as to provide a rectangular structure. An area providing this rectangular structure is called herein as contact pin arranging portion 17c. Four L-shaped guide projections 17d, in a plane view, are formed four corner portions of the peripheral portion of the rectangular accommodation portion 17b, as shown in FIG. 1, and these L-shaped guide projections 17d have a positional relationship so that the guide projections 17d are fitted to the four corner portions of the IC package 12 thereby to be positioned outside the contact pin arranging portion 17c. That is, when the IC package 12 is accommodated in the accommodation portion 17b, the corner portions thereof are guided by these guide projections 17d.

Figure 6:
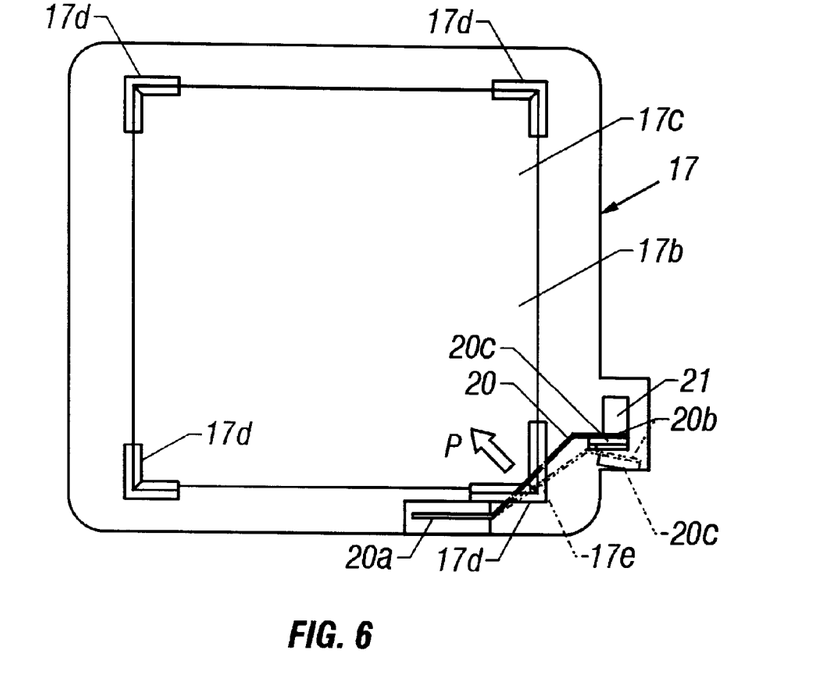
FIG. 6 is a plan view showing a contact pin base, a flat spring and a pressing block according to the first embodiment of FIG. 1.
Figure 7:
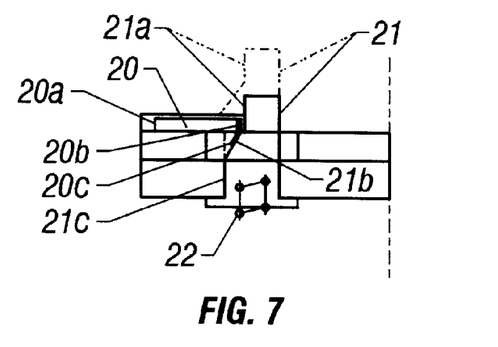
FIG. 7 showing the pressing block for explaining the motion thereof.
Figure 9:
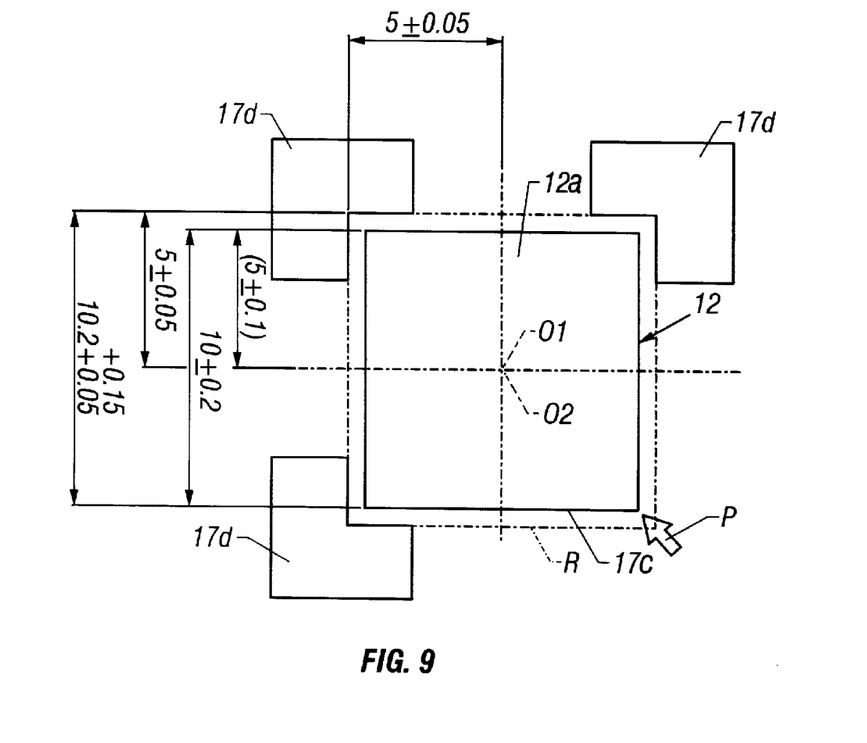
FIG. 9 is a schematic plan view showing a relationship between an IC package and a guide projection of the IC socket according to the first embodiment of FIG. 1.

To one of these guide projections 17d, right lower one as viewed in FIG. 6, there are provided a flat spring 20 and a pressing block 21 as pressing means. With reference to FIG. 9, at the time of closing the pressure cover 14, this pressing means functions to press one corner portion of the IC package 12 in a diagonal direction P so that this corner portion and other one corner portion opposed on the diagonal line abut against the corresponding guide projections 17d.

Figure 8:
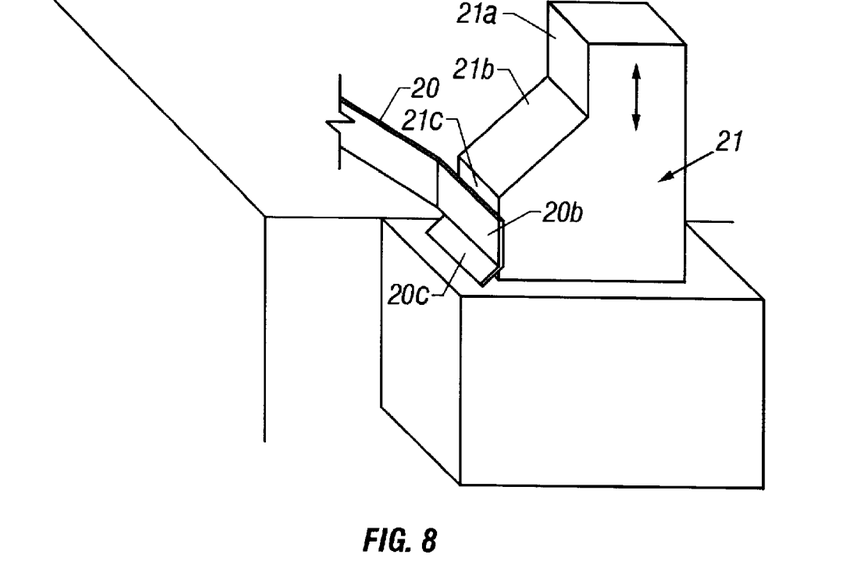
FIG. 8 is a perspective view of a structure including the flat spring, pressing block and so on according to the first embodiment shown in FIG. 1.

In more detail, the flat spring 20 has a base portion 20a fixed to the socket body 13 and extends above the accommodation portion 17b substantially horizontally, providing so-called a cantilever structure. The extended portion is inserted through a notch 17e formed to the guide projection 17d so as to face the contact pin arranging portion (17c) side. Further, as shown in FIG. 8, the flat spring 20 has a front end portion 20b having an inclination piece 20c.

Figure 4:
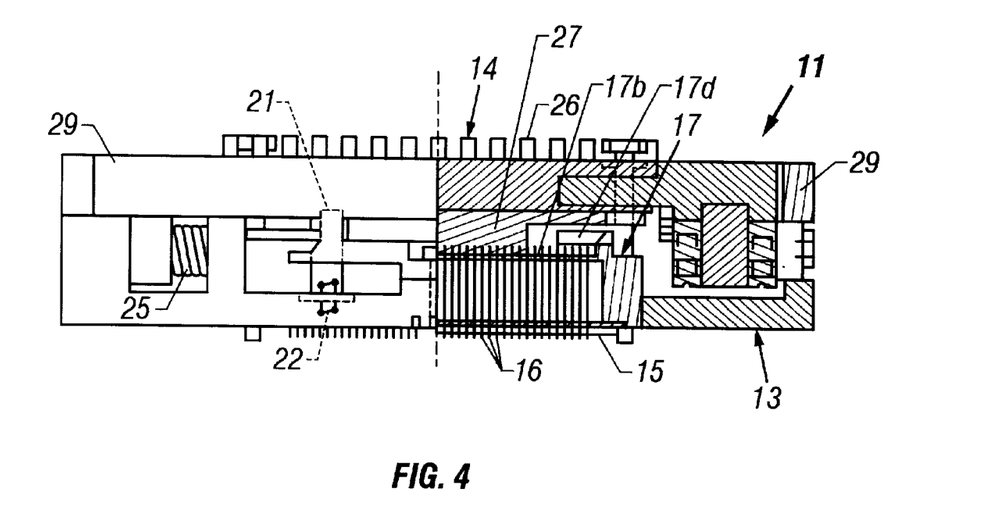
FIG. 4 is a right side view, half in section, of the IC socket of the first embodiment of FIG. 1.
Figure 5:
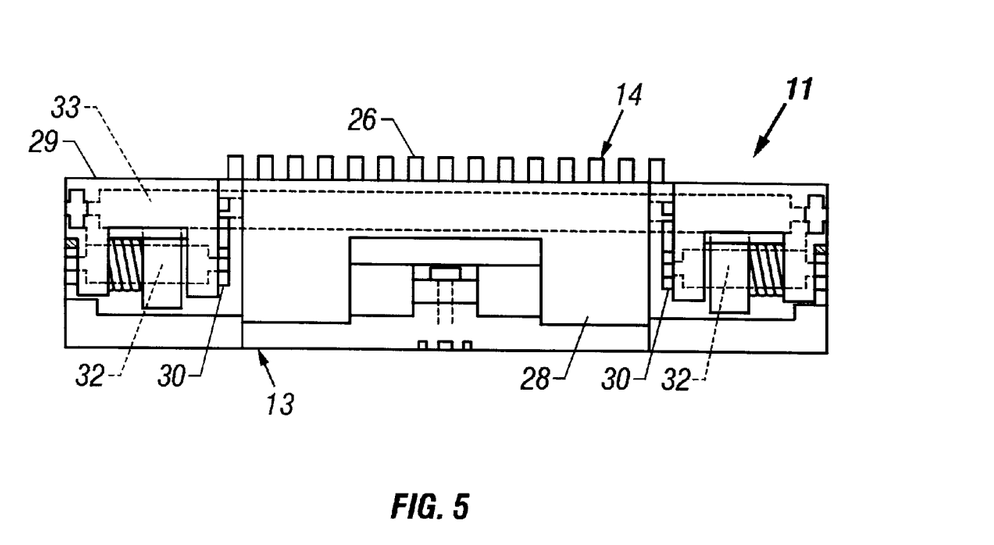
FIG. 5 is a left left side view of the IC socket of the first embodiment of FIG. 1.

On the other hand, as shown in FIG. 4, the pressing block 21 is disposed to be vertically movable with respect to the contact pin base 17 and urged upward by means of spring 22, and accordingly, when the pressure cover 14 is closed, the upper end of the pressing block 21 is pressed downward by the pressure cover 14 and then moves downward against the urging force of the spring 22. As shown in FIG. 8, the pressing block 21 has an upper perpendicular wall section 21a to which the front end portion 20b of the flat spring 20 is engaged, an intermediate inclining wall section 21b and a lower perpendicular wall section 21c in this order from the upper side thereof.

In the opened state of the pressure cover 14, the pressing block 21 is not pressed and takes its upper position at which the front end portion 20b of the flat spring 20 is engaged with the lower perpendicular wall section 21c of the pressing block 21. Accordingly, in this state, the flat spring 20 takes a position retired from the contact pin arranging portion 17c as shown with two-dot chain line in FIG. 6.

As the pressure cover 14 is being closed, the pressing block 21 is depressed and moves downward, and at this time, the front end portion 20b of the flat spring 20 slides, by its own elasticity, along the lower perpendicular wall section 21c, the intermediate inclining wall section 21b and the upper perpendicular wall section 21a while being subsequently engaged with these wall sections. When the flat spring 20 is returned to the position shown with the solid line in FIG. 6, the corner portion of the IC package 12 is pressed in the diagonal direction P.

Further, the center O1 of the rectangular contact pin arranging portion 17c formed in the accommodation portion 17b is set to a position offset towards the side of the left upper guide projection 17d as shown in FIG. 9 with respect to the center O2 of a square area R formed by lines connecting the inner surfaces of the respective guide projections 17d.

More specifically, the center O1 of this contact pin arranging portion 17c is set such that, as shown in FIG. 9, providing that the distance between the inner surfaces of respective two guide projections 17d is 10.2 mm with tolerance (common difference) of +0.05 to +0.15 mm and one side of the IC package 12 has a length of 10 mm with tolerance of ±0.2 mm, the distance from the inner surface of the guide projection 17d is of 5 mm with tolerance of ±0.05 mm.

On the other hand, the pressure cover 14 is attached to the socket body 13 to be pivotal at its base end portion about the rotational shaft 24 and urged by the spring in the direction to be opened. To the pressure cover 14, there are mounted a heat sink 26 and a pressing member 27, and by the pressing member 27, the IC package 12 is pressed.

Further, a latch member 28 engaged with the socket body 13 is provided to the front end portion of the pressure cover 14, and the latch member 28 is operated by an arm member 29 and a pair of link members 30 as connection member.

More in detail, as shown in FIG. 2, FIG. 11 and FIGS. 12A, 12B and 12C, the arm member 29 is mounted to the pressure cover 14 to be rotatable about a first shaft (shaft pin) 32, and the latch member 28 is attached to this arm member 29 to be rotatable about a second shaft (shaft pin) 33. Further, the link member 30 has one end portion 30a which is attached to the latch member 28 to be rotatable about a third shaft (shaft pin) 34 and has the other end portion 30b to which is formed a slot 30c into which a fourth shaft (shaft pin) 35 projected from the pressure cover 14 is inserted to be slidable.

Further, it will easily be noted that, in this first embodiment and a second embodiment mentioned hereinlater, each one of the arm members, the latch members, link members and others associated therewith are disposed on each of the respective sides of the pressure cover.

According to the structure mentioned above, when a pair of arm members 29 are rotated, the latch members 28 are also rotated, and then, hook portions 28a formed to the latch members 28 are engaged with the engagement portion 13a formed to the socket body 13. The detail of this operation will be described hereinlater.

The IC socket of the structure mentioned above will be used or operated in the following manner.

A plurality of IC sockets 11 are first arranged to the printed circuit board by inserting the contact pins 16 of the IC sockets 11 into the insertion holes of the printed circuit board and then soldered thereto.

Then, the IC packages 12 as electrical parts are electrically connected to the IC sockets 11 by using, for example, an automatic machine in the following manner.

That is, the IC package 12 is guided into the accommodation portion 17b of the socket body 13 by means of the guide projections 17d while the IC package 12 is being held by the automatic machine.

Next, when the pressure cover 14 is closed, in accordance with the closing operation thereof, the pressing block 21 is moved downward against the urging force of the spring 22. According to this motion, the front end portion 20b of the flat spring 20 slides along the lower perpendicular wall section 21c, the intermediate wall section 21b and the upper perpendicular wall section 21a in this order and is displaced to the state shown with the solid line from the two-dot chain line in FIG. 6 by means of the own elasticity of the flat spring 20.

In this operation, the side surface of the corner portion of the IC package 12 is pushed, by the intermediate portion of the flat spring 20, in the diagonal direction P and moved towards the guide projection 17d disposed on the upper left portion in FIG. 6. The IC package 12 stops when abutted against the guide projection 17d. At this time, the pressure cover 14 has been completely closed, the upper surface of the IC package 12 is pressed downward by the pressure cover 14 and the respective contact portions of the lower surface of the IC package 12 are contacted under pressure to the contact pins 16 of the IC socket 11, respectively. The details of the opening/closing operation of the pressure cover will be described hereinlater.

Further, it is to be easily understood that, by opening the pressure cover 14, the flat spring 20 is separated from the corner portion of the IC package 12 in the manner reverse to that mentioned above, and then, the IC package 12 can be taken out.

As mentioned above, according to the present invention, since the IC package 12 accommodated in the contact pin arranging portion 17c is pressed so that the corner portion thereof contacts the guide projection 17d, the center O1 of the rectangular contact pin arranging portion 17c formed in the accommodation portion 17b is set to a position offset towards the side of the guide projection 17d contacting the IC package 12 with respect to the center O2 of the square area R formed by lines connecting the inner surfaces of the four guide projections 17d. Accordingly, even if tolerance is caused to the IC package 12 or others, the shifted (offset) amount between the respective contact pins 16 and terminals can be made small as compared with the conventional structure.

Figure 10:
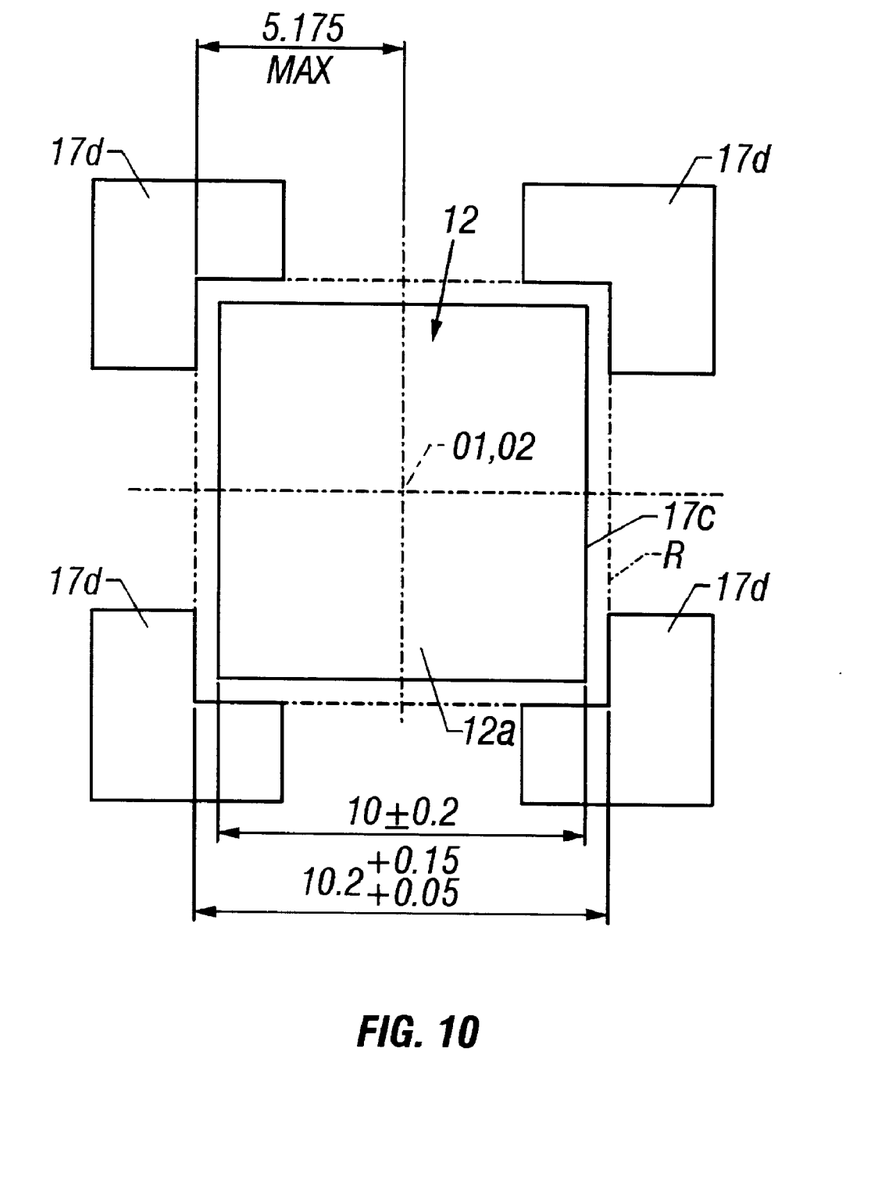
FIG. 10 is a schematic plan view showing a relationship between an IC package and a guide projection of a conventional IC socket.
Figure 11:
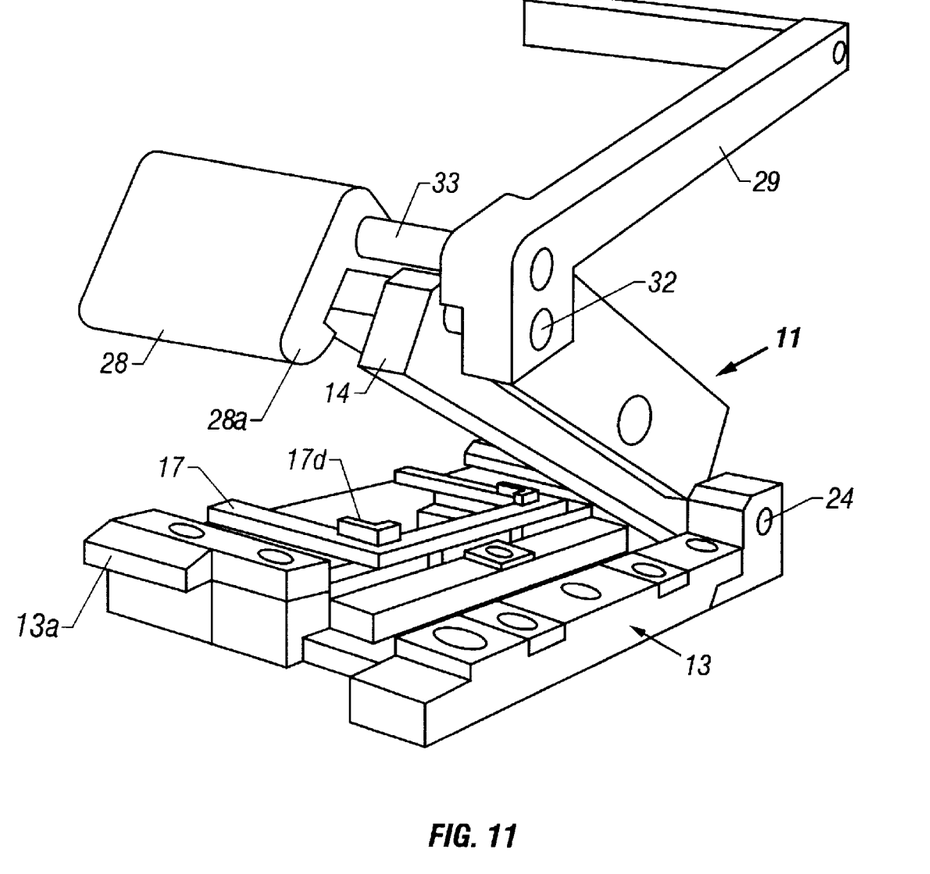
FIG. 11 is a perspective view of a structure including a latch member, an arm member and so on according to the first embodiment.

In more concrete comparison, in the conventional structure such as shown in FIG. 10, the center O1 of the contact pin arranging portion 17c is coincident with the center O2 of the square area R formed by the lines connecting the inner surfaces of four guide projections 17d. This arrangement is taken for making minimum the shifted amount between the respective contact pins and terminals if the IC package is shifted in any direction.

As like the present embodiment described above, providing that the distance between the inner surfaces of respective two guide projections 17d is 10.2 mm with tolerance of +0.05 to +0.15 mm and one side of the IC package 12 has a length of 10 mm with tolerance of ±0.2 mm, the maximum value of the clearance caused between the inner surface of the guide projection 17d and one side of the IC package 12 is expressed as (10.35−9.8)÷2=0.275, and the center of the IC package 12 is displaced by 0.275 mm in both the X and Y directions and also displaced by 0.55 mm in the square area.

On the contrary, in the embodiment of the present invention, the IC package 12 is pressed against the guide projection 17d and it is set that the center O1 of the contact pin arranging portion 17c is displaced to the position near the pressed guide projection 17d in the X and Y directions by 0.1 mm, respectively, with respect to that guide projection 17d. Accordingly, providing that the dimension of the guide projection 17d including the maximum tolerance is set to 5.05 mm and the dimension of the IC package 12 including the maximum tolerance is set to 4.9 mm, the maximum clearance is expressed as 5.05−4.9=0.15 (mm). Thus, the center of the IC package 12 is displaced by 0.15 mm in both the X and Y directions and also displaced by 0.3 mm in the square area. This means that the displacement can be suppressed about in half in comparison with the conventional structure mentioned above.

Furthermore, according to the present invention of the embodiment mentioned above, since the pressing block 21 is provided, the rotating (pivotal) motion of the pressure cover 14 can be converted to the vertical motion of the pressing block 21 thereby to elastically deform the flat spring 20, so that the entire operation is smoothly performed in comparison with the structure in which the flat spring is elastically deformed directly by the pressure cover.

The opening/closing operation of the pressure cover 14 will be described hereunder.

Figure 12A:
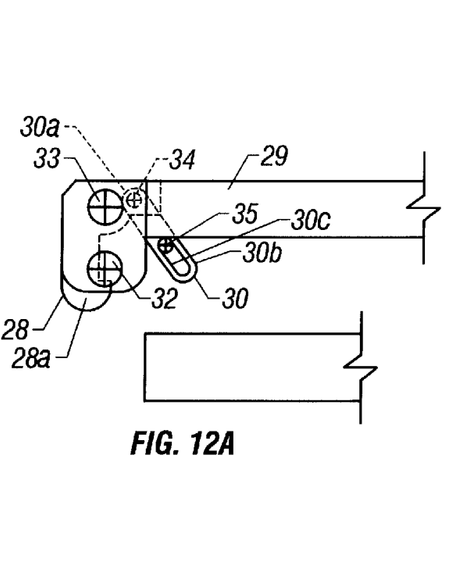
Figure 12B:
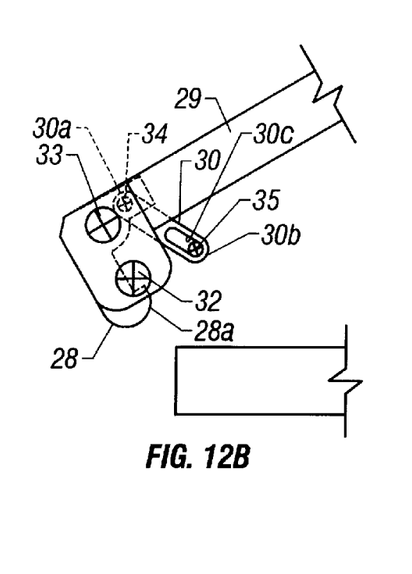
Figure 12C:
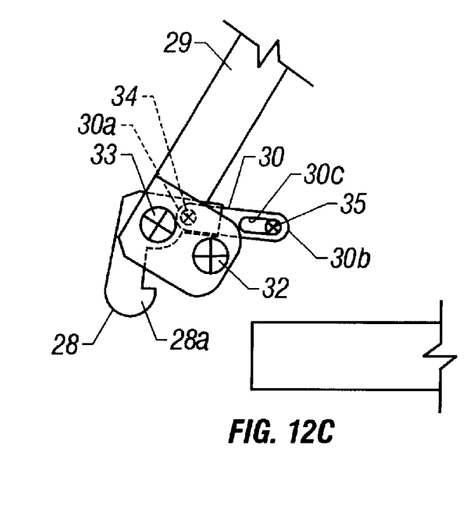

With reference to FIG. 12, at the time when the pressure cover 14 is opened from the closed state, the arm members 29 are held and rotated in the counterclockwise direction about the rotational shaft 24, as shown in FIG. 12A, from the state of the arm members 29 being fallen along the horizontal direction. At this time, as shown in FIG. 12B, the fourth shaft 35 of the pressure cover 14 is moved in the slots 30c of the link members 30, and as shown in FIG. 12C, when the arm members 29 are further rotated, the latch members 28 are pulled by the link members 28 and rotated in the clockwise direction about the second shaft 33. According to this operation, the engaging state of the engagement portion 13a of the socket body 13 with respect to the latch members 28 can be released with small operation force. When the arm members 29 are held and lifted up from this state, the pressure cover 14 can be opened.

On the other hand, at the time when the pressure cover 14 is closed from the opened state, the pressure cover 14 is rotated in its closing direction about the rotational shaft 24 with the state of the arm members 29 being held, and the pressing member 27 then abuts against the upper surface of the IC package 12. In this state, as shown in FIG. 12C, the arm members 29 take their standing-up positions and the latch members 28 are not engaged with the engagement portion 13a of the socket body 13.

The arm members 29 are then rotated in the clockwise direction about the first shaft 32 with respect to the pressure cover 14 to the position along the pressure cover (substantially horizontal state). In this time, the fourth shaft 35 is moved in the slots 30c of the link members 30 and then abut against the opposite side end edges of the slots 30c. When the arm members 29 are further rotated from this state, the latch members 28 are rotated about the second shaft 33 in the counterclockwise direction by the extending force of the link members 30 and are rotated thereby to be engaged with the engagement portion 13a of the socket body 13. When the arm member 29 are further rotated from this state, the arm members 29 are rotated in the falling direction, the latch members 28 are pulled and moved in the direction towards the upper surface of the pressure cover 14, and on the contrary, the pressure cover 14 is depressed downward thereby to increase the pressing force to the IC package 12.

As mentioned above, according to the present invention, the lever's theory is applied by the rotation of the arm members 29 through the latch members 28, and by utilizing this theory, a large engaging force or disengaging force of the latch members 28 to the socket body 13 can be achieved even by applying a small operation force to the arm members 29.

Further, the opening amount of the latch members 28 and the timing thereof may be easily changed only by exchanging the link members 30.

[Second Embodiment]

Figure 13:
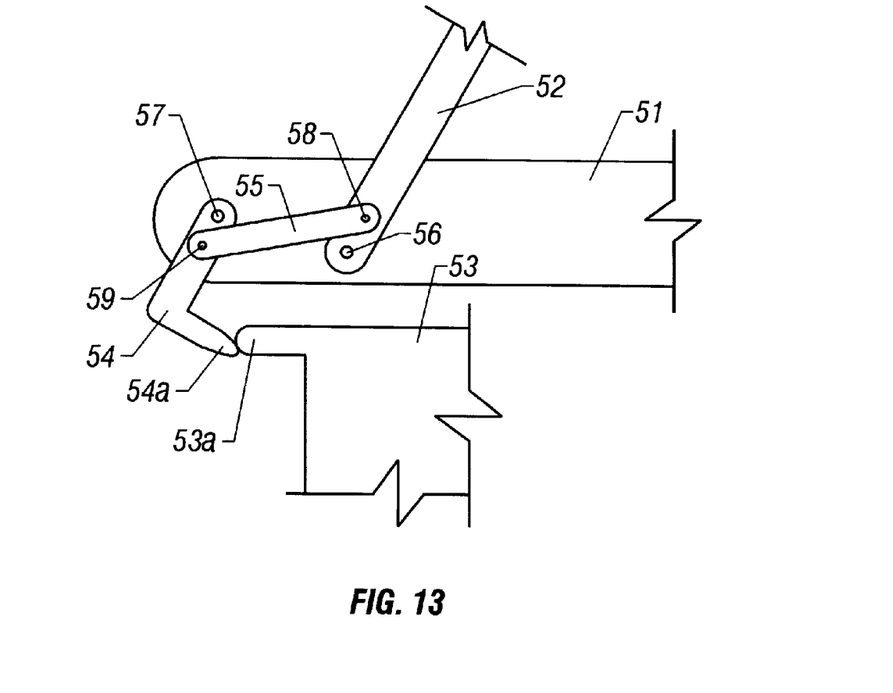
FIG. 13 is a schematic view showing a pressure cover and an arm member according to a second embodiment of the present invention.

FIG. 13 represents the second embodiment of the present invention.

In this second embodiment, with reference to FIG. 13, arm members 52 are mounted to a pressure cover 51 through a first shaft 56 to be rotatable thereabout and latch members 54 engageable with a socket body 53 are also mounted to the pressure cover 51 through a second shaft 57 to be rotatable thereabout. Link members 55 are disposed to operatively connect these arm members 52 and latch members 54 to be rotatable through third shaft 58 and fourth shaft 59, respectively.

When the arm members 52 are rotated in one direction (falling direction), the latch members 54 are rotated through the link members 54 and hook portions 54a of the latch members 54 are engaged with an engagement portion 53a of the socket body 53 in the state shown in FIG. 13. When the arm members 52 are further rotated in the same direction from the above-mentioned state, the hook portions 54a of the latch members 54 are engaged more deeply with the engagement portion 53a of the socket body 53, so that the pressure cover 51 further approaches the socket body 53.

Further, when the arm members 52 are rotated in the other direction (standing-up direction), the latch members 54 are rotated through the link members 55 in the direction released from the state being engaged with the socket body 53.

Furthermore, it is of course to be noted that, in the above embodiments, the present invention is applied to the IC socket as socket for electrical parts, the present invention is applicable to other devices or equipments, and that is, the present invention is not limited to the described embodiments and many other changes and modifications may be made without departing from the scopes of the appended claims.

What is claimed is:

1. A socket for an electrical part comprising:

a socket body having an accommodation portion in which an electrical part having a number of terminals is accommodated;

a number of contact pins arranged to the socket body so as to be contacted to or separated from the terminals of the electrical part;

a pressure cover mounted to the socket body to be pivotal at one end portion thereof in a manner that, when the pressure cover is pivoted in a cover closed direction, the electrical part accommodated in the accommodation portion of the socket body is pressed and held so that the terminals of the electrical part are contacted to the contact pins, respectively;

an arm member attached to another end portion of the pressure cover to be rotatable around a first shaft member with which said arm member is rotatably connected to another end portion of the pressure cover;

a latch member attached to the arm member to be rotatable around a second shaft member with which said latch member is connected to the arm member so that said latch member engages with or separated from the socket body;

a link member disposed between the latch member and the pressure cover;

a third shaft member with which the link member is rotatably connected to the latch member;

a fourth shaft member with which the link member is rotatably connected to the pressure cover; and a slot formed in the link member and extended to a longitudinal direction of the link member, one of said third and fourth shaft members being inserted into said slot and slidably movable along the longitudinal direction of said slot, wherein when the arm member is rotated from a standing-up position to a fallen position, the link member moves in the longitudinal direction of the slot along the inserted shaft, and when the arm member is further rotated the latch member is rotated through the link member to be engaged with the socket body, and when the arm member is further rotated in the same direction, the pressure cover further approaches the socket body, and when the arm is rotated in another direction from the fallen position to the standing-up position, the link member moves in the longitudinal direction of the slot along the inserted shaft and at the same time the engagement between the latch member and the socket body is slacked, and when the arm member is further rotated in the same direction the latch member is rotated through the link member in a direction to release the engagement of the latch member with the socket body.

2. A socket for an electrical part according to claim 1, wherein said one rotating direction of the arm member is a direction for closing the pressure cover and said another rotating direction thereof is a direction for opening the pressure cover.

3. A socket for an electrical part according to claim 1, wherein said latch member is provided with a hook and said socket body is provided with an engagement portion which is engaged with the hook of the latch member.

4. A socket for an electrical part according to claim 1, wherein said socket is an IC socket and said electrical part is an IC package.

5. A socket for an electrical part comprising:

a socket body having an accommodation portion in which an electrical part having a number of terminals is accommodated;

a number of contact pins arranged to the socket body so as to be contacted to or separated from the terminals of the electrical part;

a pressure cover mounted to the socket body to be pivotal at one end portion thereof in a manner that, when the pressure cover is pivoted in a cover closed direction, the electrical part accommodated in the accommodation portion of the socket body is pressed and held so that the terminals of the electrical part are contacted to the contact pins, respectively;

an arm member attached to another end portion of the pressure cover to be rotatable around a first shaft member with which said arm member is rotatably connected to said another end portion of the pressure cover;

a latch member attached to another end portion of the pressure cover to be rotatable around a second shaft member, with which said latch member is rotatably connected to said another end portion of the pressure cover, so as to be engaged with or separated from the socket body; and a link member disposed between the latch member and the arm member;

a third shaft member with which the link member is rotatably connected to the arm member; and a forth shaft member with which the link member is rotatably connected to the latch member;

wherein when the arm member is rotated in one direction, the latch member is rotated through the link member to be engaged with the socket body and when the arm member is further rotated in the same direction, the pressure cover further approaches the socket body, and when the arm is rotated in another direction, the latch member is rotated through the link member in a direction to release the engagement of the latch member with the socket body.

6. A socket for an electrical part according to claim 5, wherein said one rotating direction of the arm member is a direction for closing the pressure cover and said another rotating direction thereof is a direction for opening the pressure cover.

7. A socket for an electrical part according to claim 5, wherein said latch member is provided with a hook and said socket body is provided with an engagement portion which is engaged with the hook of the latch member.

8. A socket for an electrical part according to claim 5, wherein said socket is an IC socket and said electrical part is an IC package.

* * * * *

UNITED STATES PATENT AND TRADEMARK OFFICE
CERTIFICATE OF CORRECTION

PATENT NO. : 6,443,741 B1
DATED : September 3, 2002
INVENTOR(S) : Tsuyoshi Watanabe It is certified that error appears in the above-identified patent and that said Letters Patent is hereby corrected as shown below:

Title page,
Please add
-- [30]  Foreign Application Priority Data
Dec. 18, 1998 [JP] ........................... 10-360650 --

Signed and Sealed this

Thirteenth Day of May, 2003

JAMES E. ROGAN
*Director of the United States Patent and Trademark Office*